(12) United States Patent
Ogawa et al.

(10) Patent No.: US 7,167,042 B2
(45) Date of Patent: Jan. 23, 2007

(54) SEMICONDUCTOR DEVICE HAVING LOGIC CIRCUIT AND MACRO CIRCUIT

(75) Inventors: Yasushige Ogawa, Kasugai (JP); Yoshiyuki Ishida, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/757,395

(22) Filed: Jan. 15, 2004

(65) Prior Publication Data

US 2004/0145408 A1    Jul. 29, 2004

Related U.S. Application Data

(62) Division of application No. 09/642,937, filed on Aug. 22, 2000, now Pat. No. 6,700,437.

(30) Foreign Application Priority Data

Jan. 13, 2000    (JP) ............................ 2000-004773

(51) Int. Cl.
   *G05F 3/02* (2006.01)
(52) U.S. Cl. ...................... 327/544; 327/198
(58) Field of Classification Search ................ 327/143, 327/198, 530, 534, 544
   See application file for complete search history.

(56) References Cited

U.S. PATENT DOCUMENTS

| | | | | |
|---|---|---|---|---|
| 5,408,149 A | * | 4/1995 | Aneha et al. | 327/544 |
| 5,703,475 A | * | 12/1997 | Lee et al. | 323/313 |
| 5,812,017 A | * | 9/1998 | Golla et al. | 327/536 |
| 6,031,755 A | | 2/2000 | Ozawa | 365/145 |
| 6,084,800 A | | 7/2000 | Choi et al. | 327/536 |
| 6,091,277 A | | 7/2000 | Fujii | 327/407 |
| 6,161,204 A | | 12/2000 | Gans | 714/718 |
| 6,265,947 B1 | | 7/2001 | Klemmer et al. | 327/148 |
| 6,288,590 B1 | | 9/2001 | Sandhu | 327/313 |
| 6,304,114 B1 | | 10/2001 | Hirakawa | |
| 6,492,864 B1 | * | 12/2002 | Mahrla | 327/540 |
| 6,498,528 B1 | * | 12/2002 | Inagaki et al. | 327/541 |
| 6,624,673 B1 | | 9/2003 | Kim | |

\* cited by examiner

*Primary Examiner*—Kenneth B. Wells
(74) *Attorney, Agent, or Firm*—Arent Fox PLLC

(57) ABSTRACT

A semiconductor device includes both a logic circuit and a macro circuit. The macro circuit includes a circuit that consumes direct current (DC). In order to conserve power and allow for testing, the consumption of DC by the current consumption circuit can be stopped with a stop signal, which stops the operation of the macro circuit. The macro circuit can be restarted or returned to normal operation mode without risk of error caused by the stopping of the macro circuit.

5 Claims, 13 Drawing Sheets

SEMICONDUCTOR DEVICE HAVING LOGIC CIRCUIT AND MACRO CIRCUIT

This application is a divisional of U.S. patent application Ser. No. 09/642,937, filed on Aug. 22, 2000, now U.S. Pat. No. 6,700,437.

BACKGROUND OF THE INVENTION

The present invention relates to a semiconductor device, and, more particularly, to a semiconductor device on which a logic circuit and a macro circuit, such as a macro memory that consumes more power than the logic circuit, are both mounted.

FIG. 1 is a schematic block diagram of a semiconductor device 100 on which a macro memory circuit 1 and a logic circuit 2 are both mounted. A common external power supply voltage is supplied to the memory circuit 1 and the logic circuit 2.

The memory circuit 1 comprises a plurality of internal power supply generation circuits which generate a plurality of different internal power supply voltages. FIG. 2 is a schematic circuit diagram of a substrate potential generation circuit 3 which is one of the plurality of internal power supply generation circuits.

The substrate potential generation circuit 3 includes a substrate potential detection circuit 4, an oscillator circuit 5 and a pump circuit 6. The substrate potential detection circuit 4 includes a P-channel MOS transistor Tr1 having a source connected to a high potential power supply Vcc via a resistor R1 and a drain connected to a low potential power supply Vss. A substrate potential VBB is supplied to the gate of the transistor Tr1 and the source (a node N1) of the transistor Tr1 is connected to the input terminal of an inverter circuit 7a. The output signal of the inverter circuit 7a is supplied to the oscillator circuit 5 via an inverter circuit 7b.

In the substrate potential detection circuit 4, the drain current of the transistor Tr1 decreases along with an increase of the substrate potential VBB, and the potential of the node N1 increases along with a decrease of the drain current. If the potential of the node N1 is equal to or lower than the threshold of the inverter circuit 7a, the inverter circuit 7b outputs a signal having the L level. When the potential of the node N1 exceeds the threshold of the inverter circuit 7a, the inverter circuit 7b outputs a signal having the H level.

The output signal of the substrate potential detection circuit 4 is supplied to a NAND circuit 8a and the output signal of the NAND circuit 8a is supplied to the pump circuit 6 via an even number of inverter circuits 7c. The output signal of the inverter circuit 7c is also supplied to the NAND circuit 8a.

In the oscillator circuit 5, if the output signal of the substrate potential detection circuit 4 is low, the output signal of the inverter circuit 7c is maintained at the H level. When the output signal of the substrate potential detection circuit 4 goes high, the oscillator circuit 5 generates an oscillation signal having a predetermined frequency in accordance with the delay times of the NAND circuit 8a and the inverter circuit 7c.

The pump circuit 6 includes a capacitor 9 having an input terminal which receives the output signal of the oscillator circuit 5 and an output terminal connected to the anode of a diode 10a and the cathode of a diode 10b. The cathode of the diode 10a is connected to the low potential power supply Vss and the substrate potential VBB is input to the anode of the diode 10b.

In the pump circuit 6, the potential of the input terminal of the capacitor 9 rises and falls in accordance with the oscillation signal output from the oscillator circuit 5 and the potential of the output terminal of the capacitor 9 rises and falls due to the capacitive coupling of the capacitor 9. The substrate potential VBB decreases due to the rising and falling operation.

In the substrate potential generation circuit 3, direct current (D.C.) is consumed when a drain current flows in the transistor Tr1 of the substrate potential detection circuit 4. Accordingly, the current consumption of the memory circuit 1 comprising a plurality of substrate potential generation circuits 3 is higher than that of the logic circuit 2. Thus, the normal operation of an internal power supply generation circuit such as the substrate potential generation circuit 3 increases the current consumption of the entire semiconductor device 100. Further, when the memory circuit 1 operates normally, whether the operating current of the logic circuit 2 is normal cannot be tested.

To reduce power consumption, the supply of the power to the memory circuit 1 should be cut off when the memory circuit 1 is not used. However, if a power supply voltage is supplied to the memory circuit 1 and the logic circuit 2 via a common power line, the power cannot be cut off only for the memory circuit 1.

If a power supply voltage is supplied separately to the memory circuit 1 and the logic circuit 2, only the power for the memory circuit 1 can be cut off. In this case, however, a malfunction such as hang-up operation or latch-up operation occurs due to the power supply potential difference when the power is cut off, causing the operation to become unstable.

SUMMARY OF THE INVENTION

An object of the present invention is to provide a semiconductor device which operates stably and has reduced power consumption.

In one aspect of the present invention, a semiconductor device includes a logic circuit and a macro circuit including a circuit that consumes direct current and stops operation in response to a stop signal.

A first switching circuit may be applied to the direct current consumption circuit. The first switch cuts off the direct current flowing in the direct current consumption circuit in response to the stop signal.

The macro circuit may include a data transfer circuit for generating a transfer data signal from an input data signal in accordance with a clock signal. A first reset circuit is connected to the data transfer circuit to reset the transfer data signal of the data transfer circuit in response to a reset signal. A power-on reset circuit is connected to the first reset circuit to generate the reset signal when power is provided thereto. A start signal generation circuit generates a start signal when the stop signal is deactivated. A second reset circuit is connected to the start signal generation circuit and the data transfer circuit to reset the transfer data signal in response to the start signal.

The macro circuit may include a data transfer circuit for generating a transfer data signal from an input data signal in accordance with a clock signal. A power-on reset circuit generates a reset signal when power is provided thereto. A start signal generation circuit generates a start signal when the stop signal is deactivated. A composite circuit is connected to the power-on reset circuit and the start signal generation circuit to generate a composite reset signal by combining the start signal and the reset signal. A reset circuit is connected to the composite circuit to reset the transfer data signal in response to the composite reset signal.

The macro circuit includes a data transfer circuit for generating a transfer data signal from an input data signal in accordance with a clock signal. A power-on reset circuit generates a reset signal when power is provided thereto. A composite circuit is connected to the power-on reset circuit to generate a composite reset signal by combining the stop signal and the reset signal. A reset circuit is connected to the composite circuit to reset the transfer data signal in response to the composite reset signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
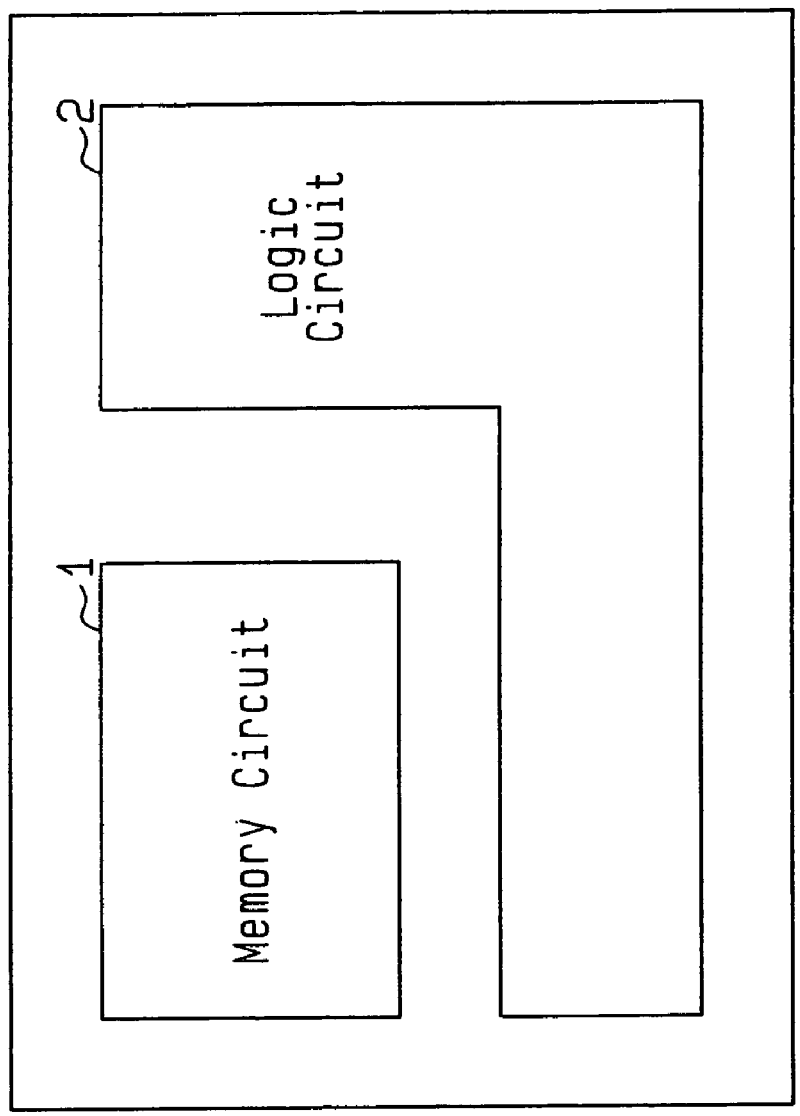
FIG. 1 is a schematic block diagram of a conventional semiconductor device.
Figure 2:
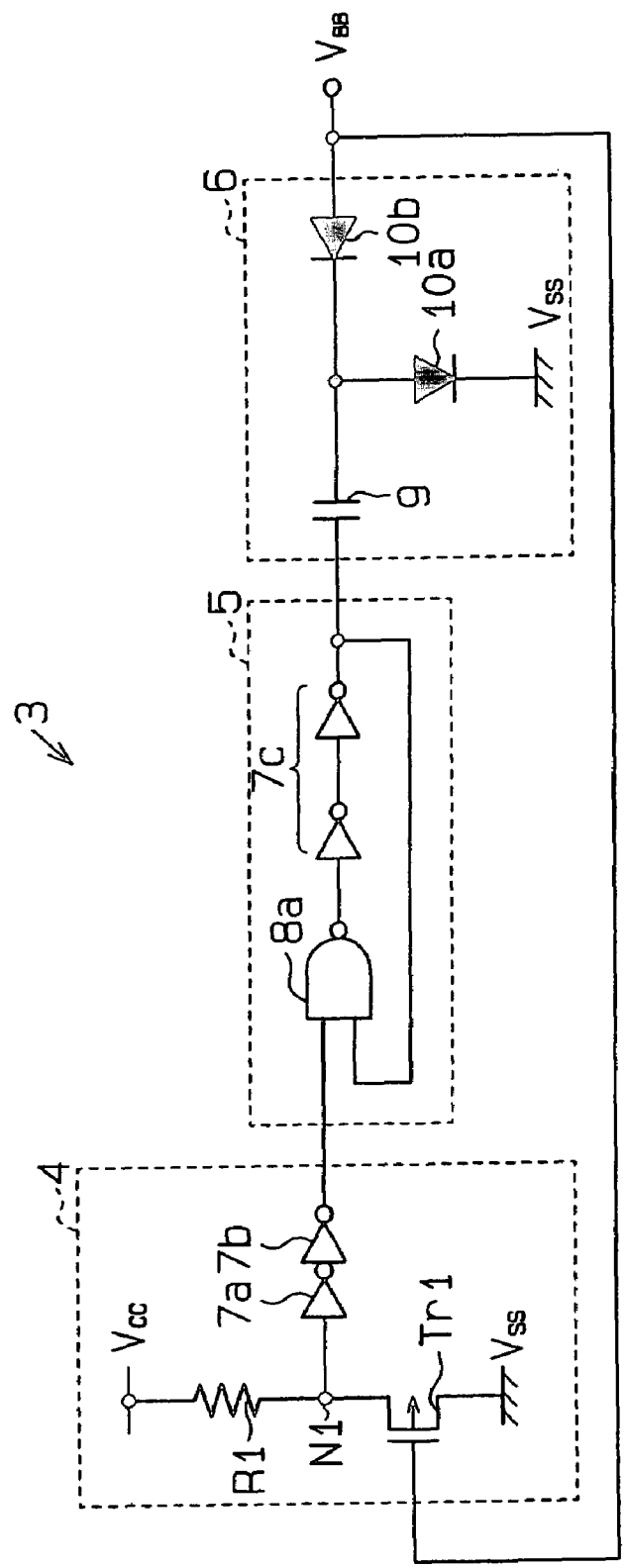
FIG. 2 is a schematic circuit diagram of a conventional substrate potential generation circuit.

In the drawings, like numerals are used for like elements throughout.

(First Embodiment)

Figure 3:
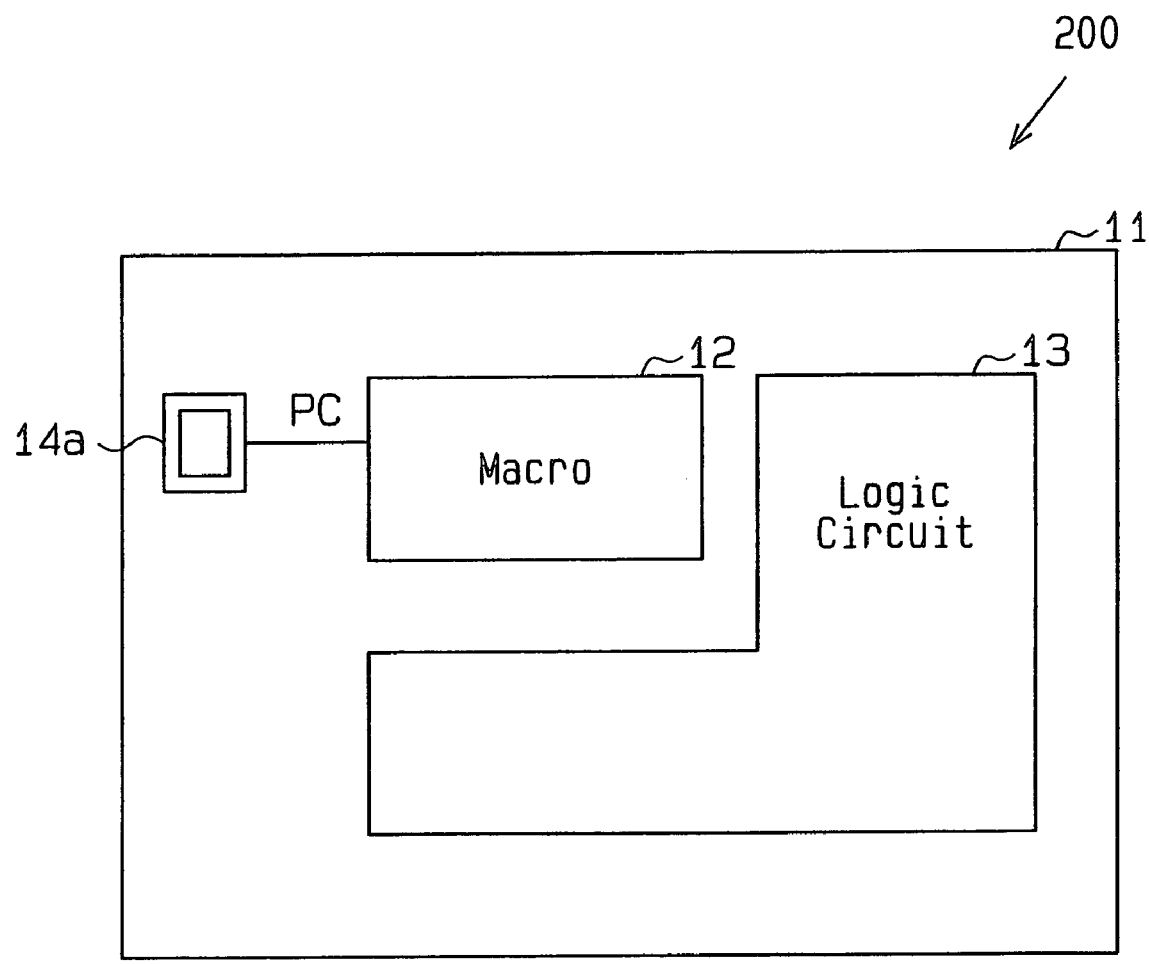
FIG. 3 is a schematic block diagram of a semiconductor device according to a first embodiment of the present invention.

FIG. 3 is a schematic circuit diagram of a one-chip semiconductor device 200 according to a first embodiment of the present invention. A logic circuit 13 and a macro circuit 12 are mounted on a semiconductor substrate 11 and a common power supply voltage is supplied to both the logic circuit 13 and the macro circuit 12. The macro circuit 12 receives a stop signal PC via an external terminal 14a and enters the stop mode in response to the stop signal PC. In the stop mode, a circuit in the macro circuit 12 which consumes direct current is deactivated, which decreases the current consumption of the macro circuit 12.

(Second Embodiment)

Figure 4:
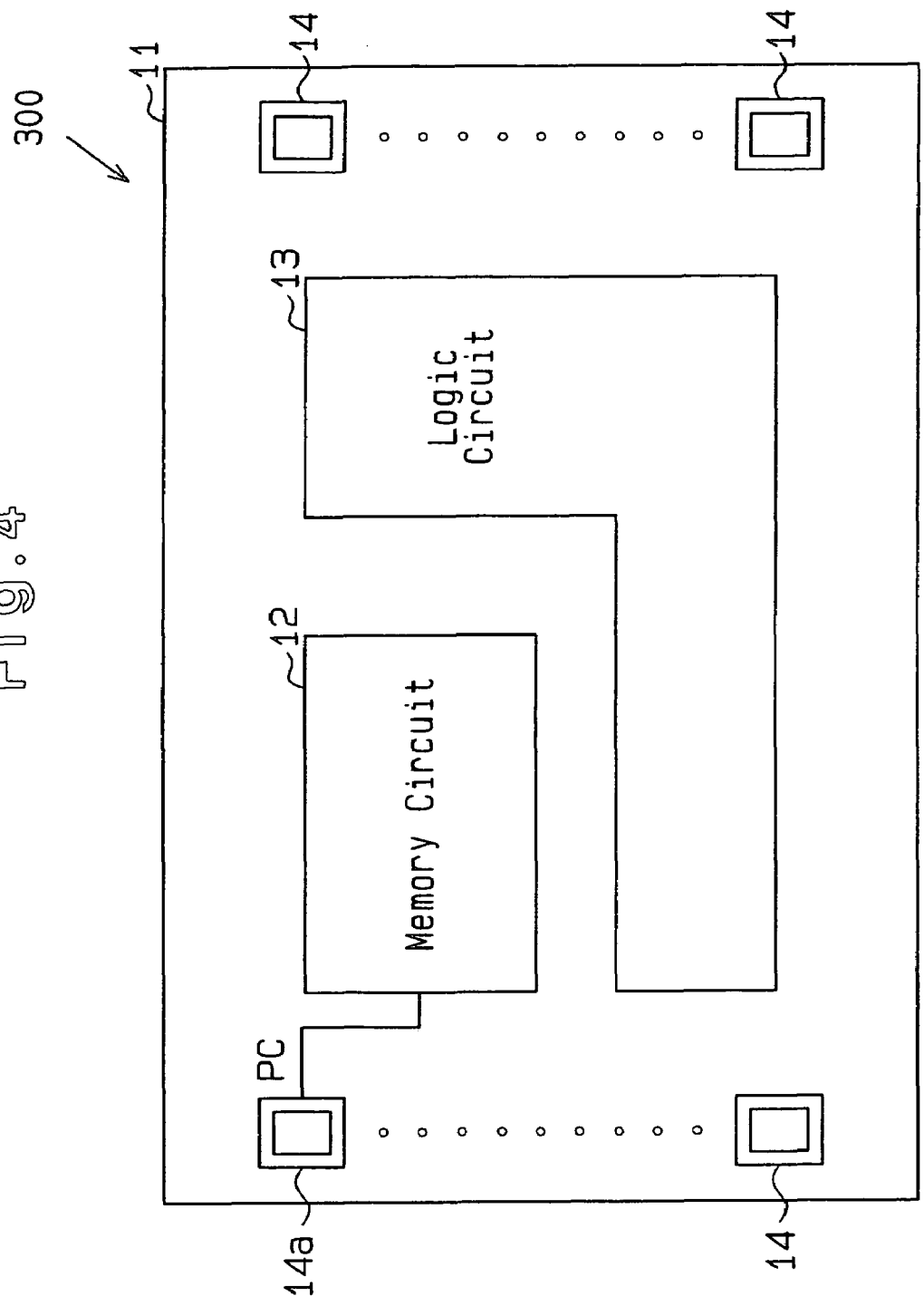
FIG. 4 is a schematic block diagram of a semiconductor device according to a second embodiment of the present invention.

FIG. 4 is a schematic circuit diagram of a one-chip semiconductor device 300 according to a second embodiment of the present invention. The semiconductor device 300 comprises the macro memory circuit 12 and the logic circuit 13 each of which is formed on a semiconductor substrate 11. A plurality of external terminals 14 are formed on the periphery of the semiconductor substrate 11 and a stop signal PC is supplied to the memory circuit 12 from one of the external terminals 14a. The stop signal PC is used to stop the operation of an internal power supply generation circuit in the memory circuit 12, which thereby decreases the current consumption of the memory circuit 12.

A common power supply voltage is supplied from the common external terminals 14 to the memory circuit 12 and the logic circuit 13.

Figure 5:
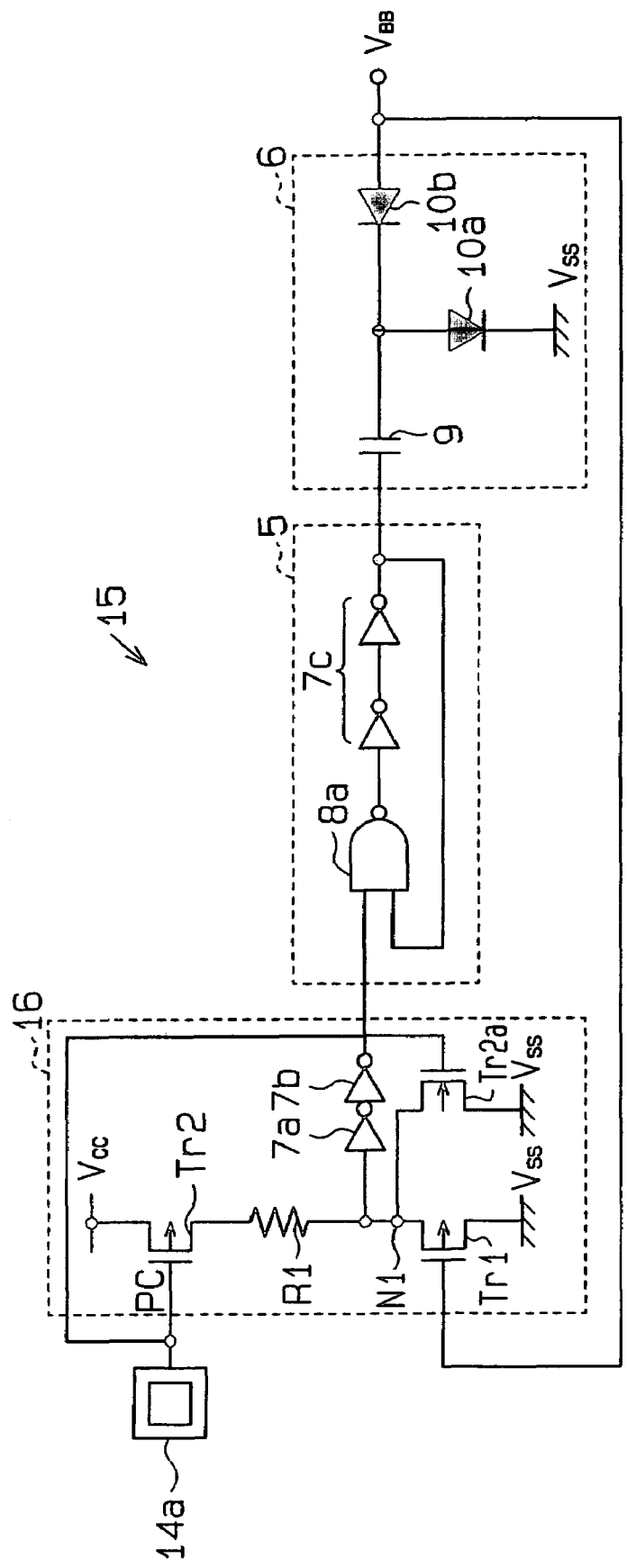
FIG. 5 is a schematic circuit diagram of the substrate potential generation circuit of the semiconductor device of FIG. 4.

The stop signal PC is supplied to a substrate potential generation circuit 15, which is the internal power supply generation circuit. As shown in FIG. 5, a substrate potential detection circuit 16 of the substrate potential generation circuit 15 includes a P-channel MOS transistor Tr2 connected between a high potential power supply Vcc and a resistor R1 and the stop signal PC is supplied to the gate of the transistor Tr2. The substrate potential detection circuit 16 serves as an internal power supply potential detection circuit. The substrate potential detection circuit 16 further includes an N-channel MOS transistor Tr2a connected in parallel to a transistor Tr1 and the stop signal is supplied to the gate of the transistor Tr2a.

In a normal mode in which the memory circuit 12 operates, the stop signal PC has the L level, and in the stop mode in which the memory circuit 12 does not operate, the stop signal has the H level.

When the stop signal PC has the L level, the transistor Tr2 is turned on and a drain current flows from the transistor Tr2 to the transistor Tr1 via the resistor R1. The substrate potential generation circuit 15 is activated and predetermined substrate potential VBB is generated.

When the stop signal PC has the H level, the transistor Tr2 is turned off and the transistor Tr2a is turned on. Thereupon, the flow of the drain current (DC current) in the transistor Tr1 is cut off and the substrate potential generation circuit 15 is deactivated. At this time, an inverter circuit 7b outputs a signal having the L level.

Figure 6:
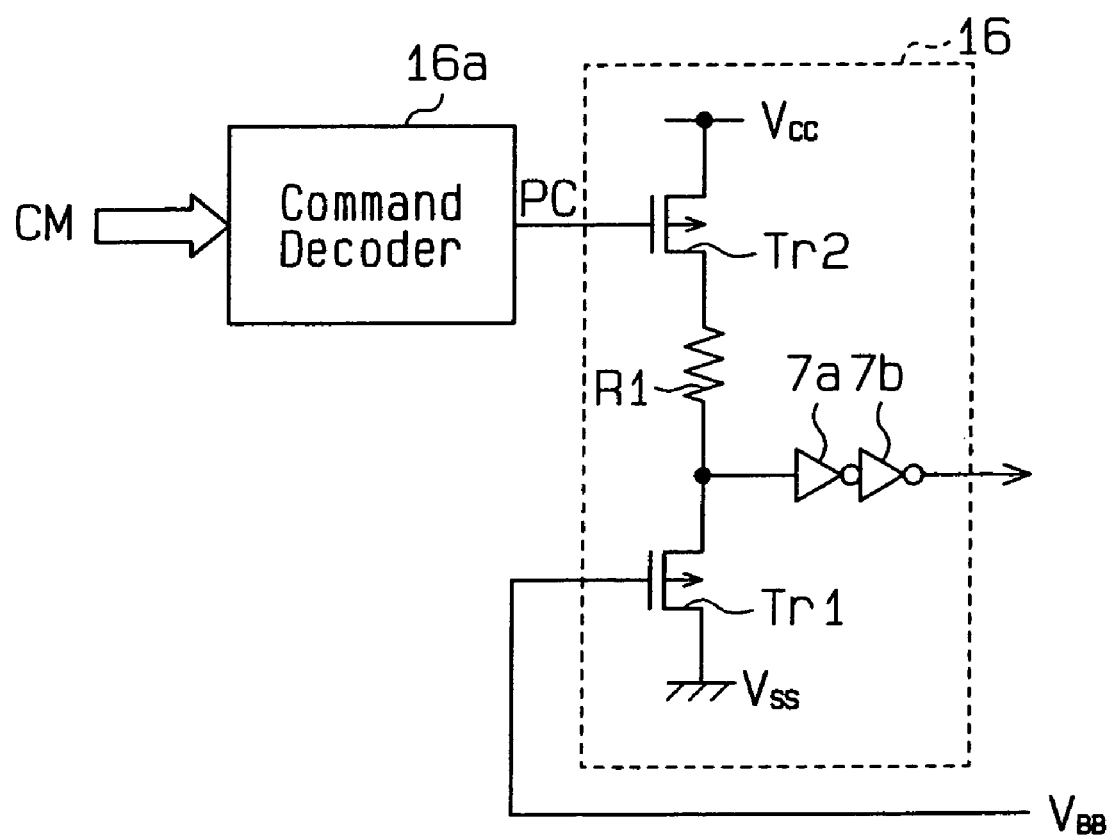
FIG. 6 is a schematic circuit diagram of another example of a substrate potential generation circuit.

As shown in FIG. 6, the stop signal PC is preferably generated by a command decoder 16a provided in the memory circuit 12. The command decoder 16*a* receives a command signal CM from an external device, decodes the command signal CM and generates the stop signal PC. Command decoder circuits are well-known to persons skilled in the art.

Figure 7:
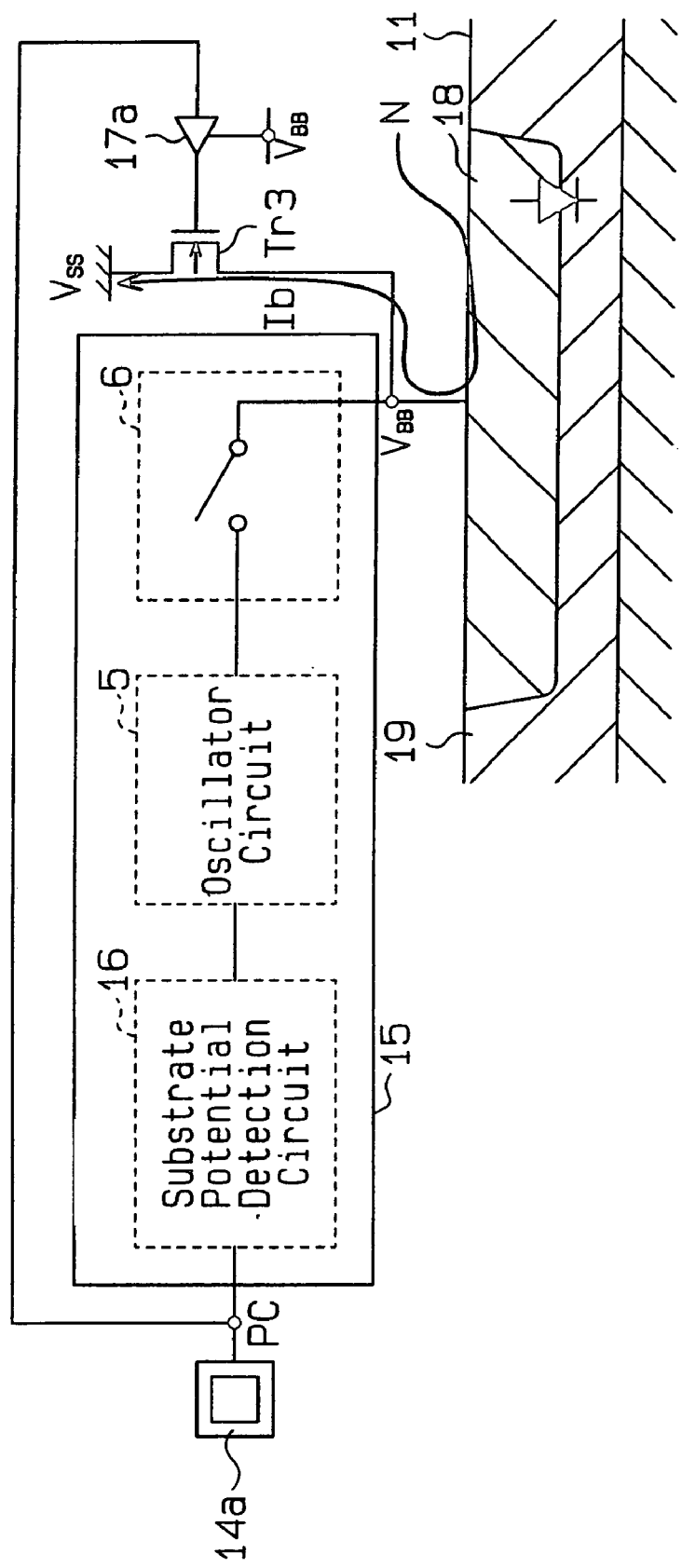
FIG. 7 is a schematic block diagram of a substrate potential generation circuit and a partial cross-sectional view of a substrate.

As shown in FIG. 7, the stop signal PC is also supplied to the gate of an N-channel MOS transistor Tr3 via a buffer circuit 17*a*. The source of the transistor Tr3 is connected to a low potential power supply Vss and the drain is connected to a P-type diffusion area 18 on the semiconductor substrate 11. The P-type diffusion area 18 is formed in an N-type diffusion area 19.

The substrate potential VBB, as a low-potential, is supplied to the buffer circuit 17*a*. The buffer circuit 17*a* supplies a signal having the substrate potential VBB to the gate of the transistor Tr3 in response to the stop signal PC having the L level, which turns off the transistor Tr3. That is, the buffer circuit 17*a* has a level shift function.

Next, the operation of the semiconductor device 300 is described.

The transistor Tr2 of the substrate potential detection circuit 16 is turned off in response to the stop signal PC having the H level. Thereupon, a node N1 is set to the L level. The substrate potential detection circuit 16 outputs an output signal having the L level and stops the oscillation operation of the oscillator circuit 5, i.e., the operation of the substrate potential generation circuit 15. As a result, the flow of the drain currents of the transistors Tr2 and Tr1 of the substrate potential detection circuit 16 are cut off and the switching current of the oscillator circuit 5 is also cut off.

When the operation of the substrate potential generation circuit 15 stops, the substrate potential VBB becomes unstable. However, even if a noise N invades the P-type diffusion area 18 when the operation of the substrate potential generation circuit 15 stops, a noise current Ib flows to the power supply Vss as the drain current of the transistor Tr3 because the transistor Tr3 is turned on. Further, the substrate potential VBB is fixed to the power supply Vss. Therefore, the occurrence of a defect, such as the latch-up operation of the memory circuit 1 or logic circuit 2 due to the noise current is prevented.

Figure 8:
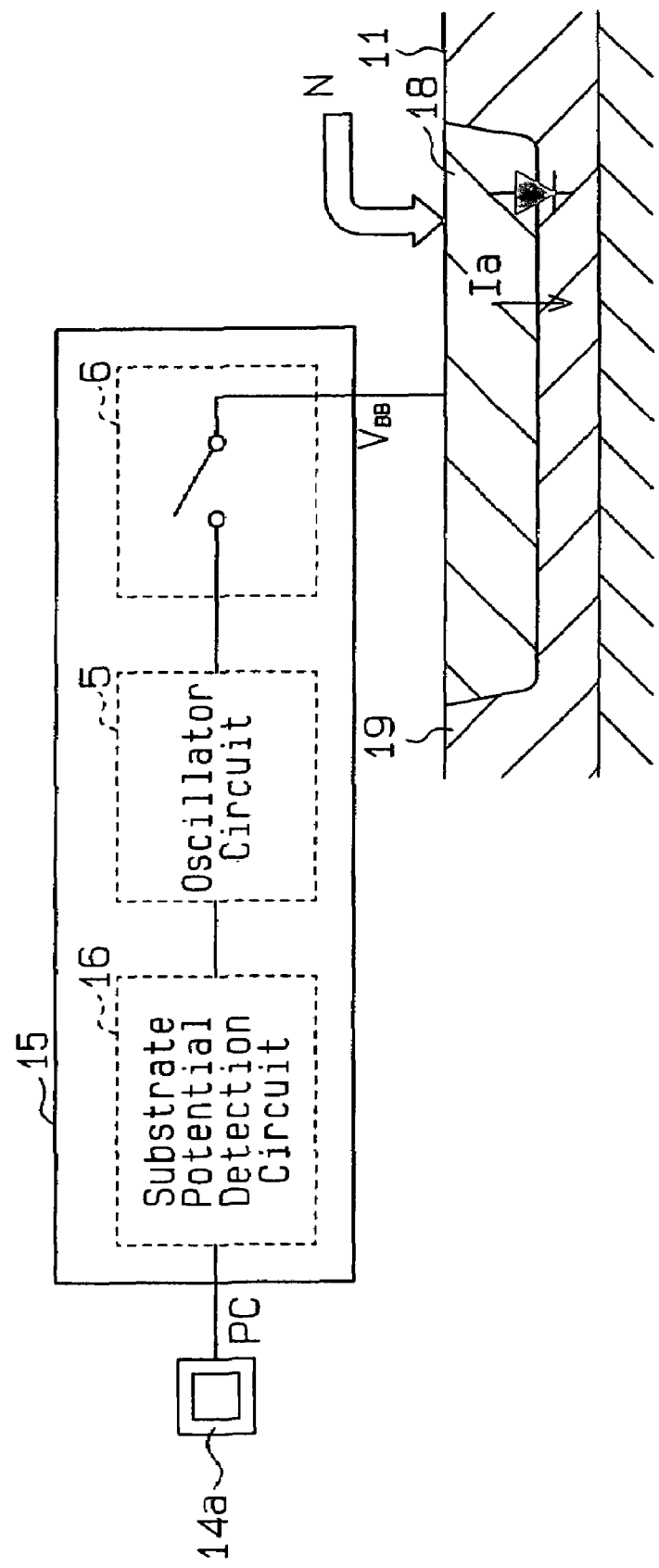
FIG. 8 is a schematic block diagram of another substrate potential generation circuit and a partial cross-sectional view of a substrate.

When the buffer circuit 17*a* and the transistor Tr3 are not provided, as shown in FIG. 8, if the operation of the substrate potential generation circuit 15 is stopped using a stop signal PC, the pump circuit 6 enters a state in which a switch is opened. In this state, when the positive potential noise N invades the P-type diffusion area 18 and a voltage exceeding the threshold of the PN junction between the P-type diffusion area 18 and the N-type diffusion area 19 is applied to the PN junction, a high noise current Ia flows in the PN junction.

The semiconductor device 300 of the second embodiment has the following advantages.

(1) The substrate potential generation circuit 15 of the memory circuit 12 cuts off the D.C. consumed by the substrate potential generation circuit 15 in accordance with a stop signal PC. Accordingly, the current consumption of the memory circuit 12 is decreased.

(2) By cutting off the D.C. consumed by the substrate potential generation circuit 15, test of D.C. when the logic circuit 13 is not being operated and test of an operating current when the logic circuit 13 is being operated can be performed.

(3) Since the D.C. consumed by the substrate potential generation circuit 15 is cut off without cutting off the power of the memory circuit 12, the occurrence of a defect such as latch-up operation is prevented.

(4) The D.C. consumed by the memory circuit 12 is cut off by supplying a stop signal PC from the external terminal 14*a* to the substrate potential generation circuit 15. Accordingly, the user can optionally select the stop mode in which the current consumption of the memory circuit 12 is decreased and the current test of the logic circuit 13 is enabled.

(5) If the operation of the substrate potential generation circuit 15 is stopped, the substrate potential VBB is fixed to the power supply Vss level. Accordingly, the occurrence of malfunctions of the memory circuit 12 and the logic circuit 13 due to the noise N is prevented.

(Third Embodiment)

Figure 9:
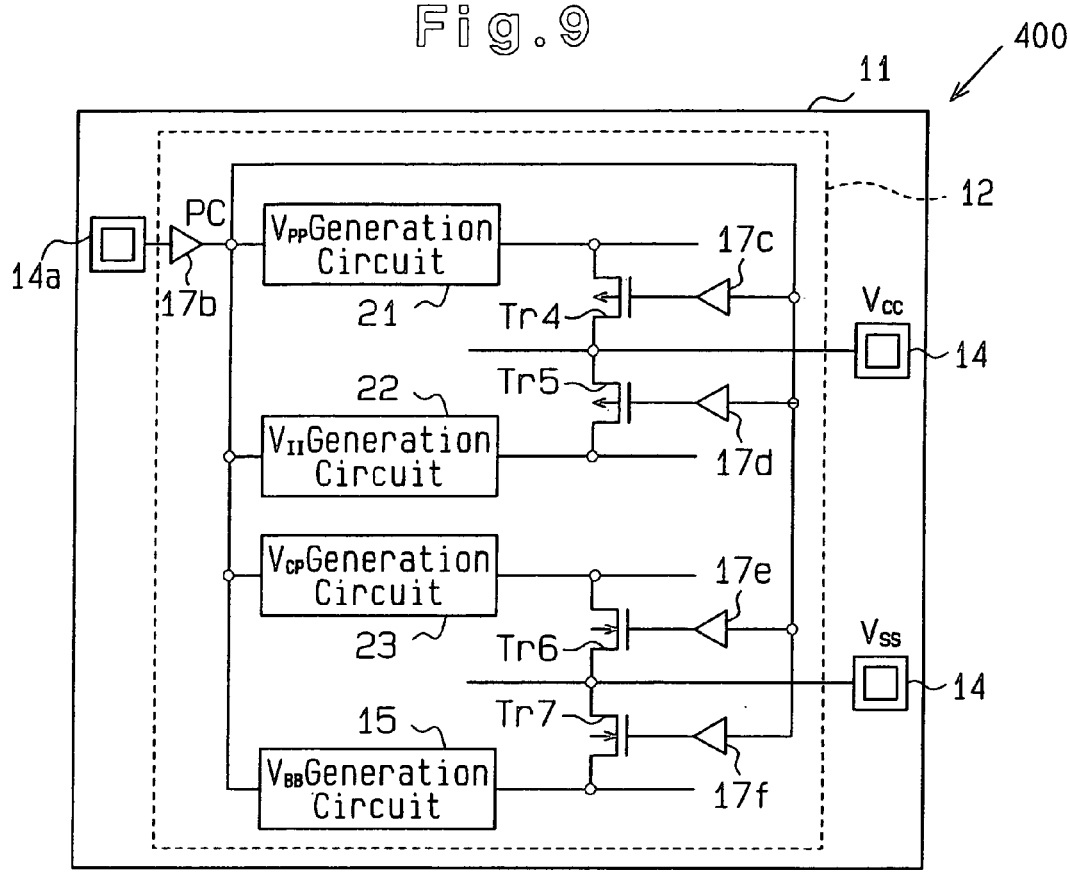
FIG. 9 is a schematic circuit diagram of a semiconductor device according to a third embodiment of the present invention.

FIG. 9 is a schematic circuit diagram of a semiconductor device 400 according to a third embodiment of the present invention. The macro memory circuit 12 comprises the substrate potential generation circuit 15, a boosting power supply generation circuit 21 that generates a boosting power supply Vpp, a deboosting power supply generation circuit 22 that generates a deboosting power supply (step-down power Supply) VII, and a precharge power supply generation circuit 23 that generates a precharge power supply VCP. Each of the boosting power supply generation circuit 21, the deboosting power supply generation circuit 22, and the precharge power supply generation circuit 23 has the same configuration as the substrate potential generation circuit 15, stops the operation in accordance with a stop signal PC, and fixes the stop potential to the potential of the power supply Vcc or Vss.

The boosting power supply generation circuit 21 generates a power supply voltage of 5 V from the power supply Vcc of 3 V, for example. The deboosting power supply generation circuit 22 generates a power supply voltage of 2 V from the power supply Vcc of 3 V, for example. The precharge power supply generation circuit 23 generates a power supply voltage of 1.5 V from the power supply Vcc of 3 V, for example.

The stop signal PC supplied to the external terminal 14*a* is supplied to the boosting power supply generation circuit 21, the deboosting power supply generation circuit 22, the precharge power supply generation circuit 23 and the substrate potential generation circuit 15 via a buffer circuit 17*b*.

The output signal PC of the buffer circuit 17*b* is also supplied to buffer circuits 17*c* to 17*f* and the output signals of the buffer circuits 17*c* to 17*f* are supplied to the gates of switching transistors Tr4 to Tr7, respectively. The respective buffer circuits 17*c* to 17*f* turn off the respective transistors Tr4 to Tr7 in response to a stop signal PC having the L level, respectively.

The output terminal of the boosting power supply generation circuit 21 is connected to the power supply Vcc via the transistor Tr4 and the output terminal of the deboosting power supply generation circuit 22 is connected to the power supply Vcc via the transistor Tr5. The output terminal of the precharge power supply generation circuit 23 is connected to the power supply Vss via the transistor Tr6 and the substrate potential generation circuit 15 is connected to the power supply Vss via the transistor Tr7.

When a stop signal PC having the H level is supplied to the external terminal 14*a*, each of the boosting power supply generation circuit 21, deboosting power supply generation circuit 22, precharge power supply generation circuit 23 and substrate potential generation circuit 15 stops its operation and each of the transistors Tr4 to Tr7 is turned on. Thereupon, the output signals of the boosting power supply generation circuit 21 and deboosting power supply generation circuit 22 are fixed to the level of the power supply Vcc and the output terminals of the precharge power supply generation circuit 23 and substrate potential generation circuit 15 are fixed to the level of the power supply Vss.

(Fourth Embodiment)

Figure 10:
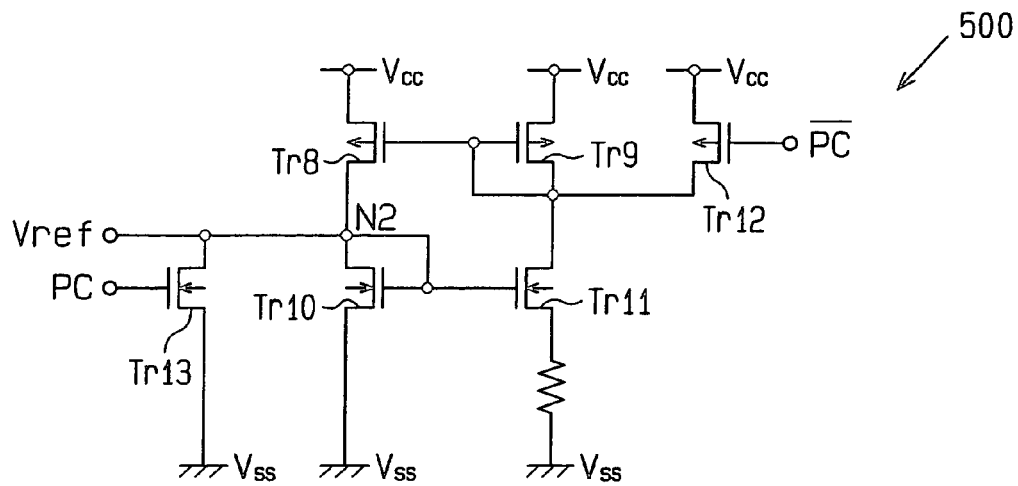
FIG. 10 is a schematic circuit diagram of a conventional reference voltage generation circuit.

FIG. 10 is a schematic circuit diagram of a conventional reference potential generation circuit 500 which is provided in a memory circuit and one of the internal power supply generation circuits. The reference potential generation circuit 500 consumes D.C. during normal operation.

In the reference potential generation circuit 500, the power supply voltage Vcc is supplied to the sources of P-channel MOS (PMOS) transistors Tr8 and Tr9. The gates of the PMOS transistors Tr8 and Tr9 are connected to each other and connected to the drain of the PMOS transistor Tr9.

The drain of the PMOS transistor Tr8 is connected to the drain of an N-channel MOS (NMOS) transistor Tr10 and connected to the gates of the NMOS transistor Tr10 and an NMOS transistor Tr11. The drain of the PMOS transistor Tr9 is connected to the drain of the NMOS transistor Tr11. The sources of the NMOS transistors Tr10 and Tr11 are connected to the power supply Vss.

A PMOS transistor Tr12 is connected in parallel to the NMOS transistor Tr9 and a stop signal /PC is supplied to the gate of the PMOS transistor Tr12. An NMOS transistor Tr13 is connected in parallel to the NMOS transistor Tr10 and a stop signal PC is supplied to the gate of the NMOS transistor Tr13.

In the reference potential generation circuit 500, when the stop signal PC has the L level, a power supply Vcc and a power supply Vss are supplied, each of the transistors Tr8 to Tr11 is turned on and a predetermined reference voltage Vref is generated at the drain (a node N2) in accordance with the on-resistance of the transistors Tr8 to Tr11. In this state, a drain current flows in the PMOS transistor Tr8 and the NMOS transistor Tr10 and a drain current flows in the PMOS transistor Tr9 and the NMOS transistor Tr11, thereby consuming the predetermined D.C.

When the stop signal PC goes high, the transistors Tr12 and Tr13 are turned on. Thereupon, the gate potentials of the PMOS transistors Tr8 and Tr9 are set to substantially the level of power supply Vcc and the PMOS transistors Tr8 and Tr9 are turned off. At the same time, the gates potential of the NMOS transistors Tr10 and Tr11 are set to substantially the level of power supply Vss and the NMOS transistors Tr10 and Tr11 are turned off. As a result, the reference potential generation circuit 500 enters the stop mode, stops the operation and cuts off D.C.

However, the reference potential generation circuit 500 does not operate normally if the stop signal PC is switched from the H level to the L level (even if the normal mode is returned to from the stop mode). That is, even if the transistors Tr12 and Tr13 are switched from the ON state to the OFF state, the transistors Tr8 to Tr11 are kept in the OFF state and the predetermined reference voltage Vref is not generated. Accordingly, to reset the stop mode of the reference potential generation circuit 500, the power supply Vcc and the power supply Vss need to be provided again after they have been cut off once.

Figure 11:
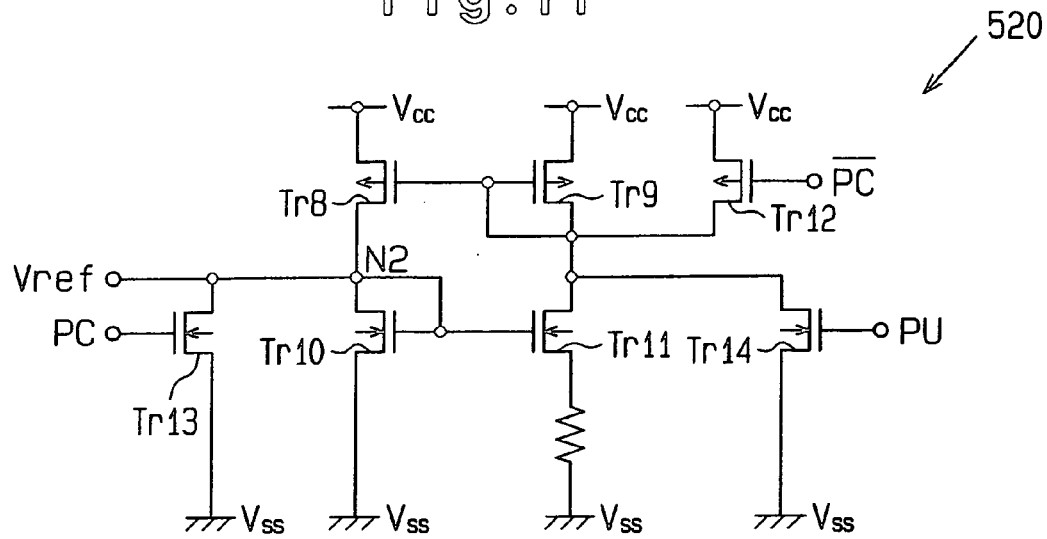
FIG. 11 is a schematic circuit diagram of a reference voltage generation circuit according to a fourth embodiment of the present invention.

FIG. 11 is a schematic circuit diagram of a reference voltage generation circuit 520 according to a fourth embodiment of the present invention in which the stop mode can move to the normal mode without turning on the power again.

The reference voltage generation circuit 520 comprises an NMOS transistor Tr14 connected in parallel to the NMOS transistor Tr11. A start signal PU is supplied to the NMOS transistor Tr14.

Figure 12:
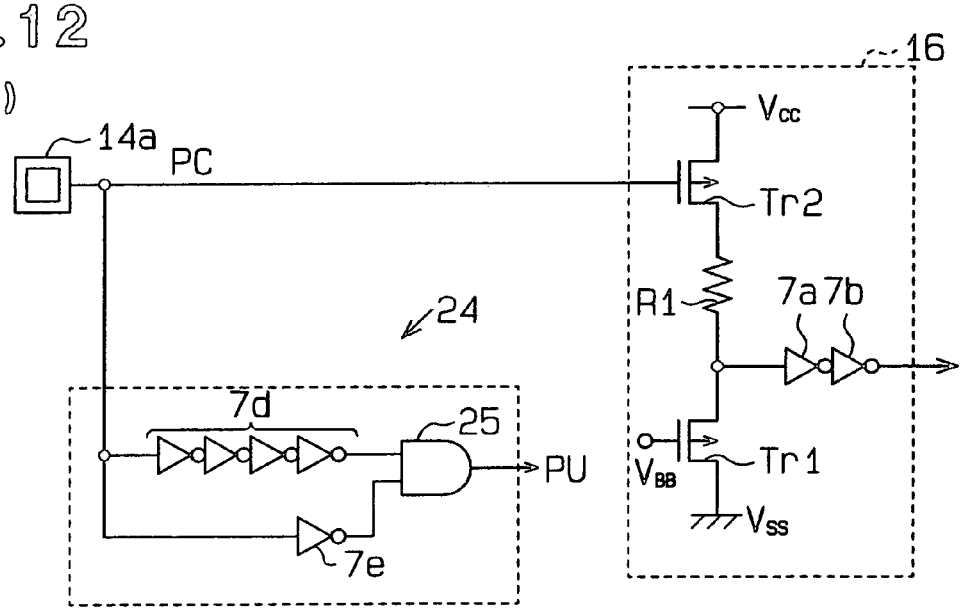
FIG. 12(a) is a schematic circuit diagram of a start signal generation circuit and FIG. 12(b) is a signal waveform diagram showing the operation of the start signal generation circuit.
Figure 12:
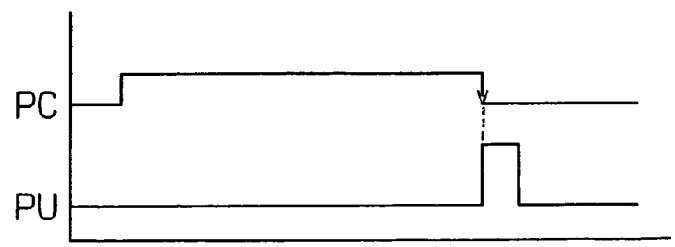

FIG. 12(a) is a schematic circuit diagram of a start signal generation circuit 24 which generates the start signal PU from the stop signal PC. In the start signal generation circuit 24, the stop signal PC is supplied to the first input terminal of an AND circuit 25 via four inverter circuits 7d. The stop signal PC is also supplied to the second input terminal of the AND circuit 25 via an inverter circuit 7e. The start signal PU is output from the AND circuit 25. That is, as shown in FIG. 12(b), when the stop signal PC falls from the H level to the L level, the start signal PU having an H-level pulse width that corresponds to the difference between the operation delay time of the inverter circuits 7d and the operation delay time of the inverter circuit 7e is generated. When the stop signal PC is fixed to the H level or the L level or when the stop signal PC rises from the L level to the H level, the start signal PU is maintained at the L level.

When the stop signal PC falls from the H level to the L level and the normal mode is returned from the stop mode, the start signal PU, which stays high for a predetermined period of time, is supplied to the NMOS transistor Tr14. Thereupon, the transistor Tr14 is turned on and the transistors Tr8 and Tr9 are turned on. Subsequently, the transistors Tr10 and Tr11 are turned on and the reference voltage Vref is generated. Thus, the reference voltage generation circuit 520 is automatically restarted without again turning on the power supply Vcc and the power supply Vss when the stop mode moves to the normal mode.

(Fifth Embodiment)

Figure 13:
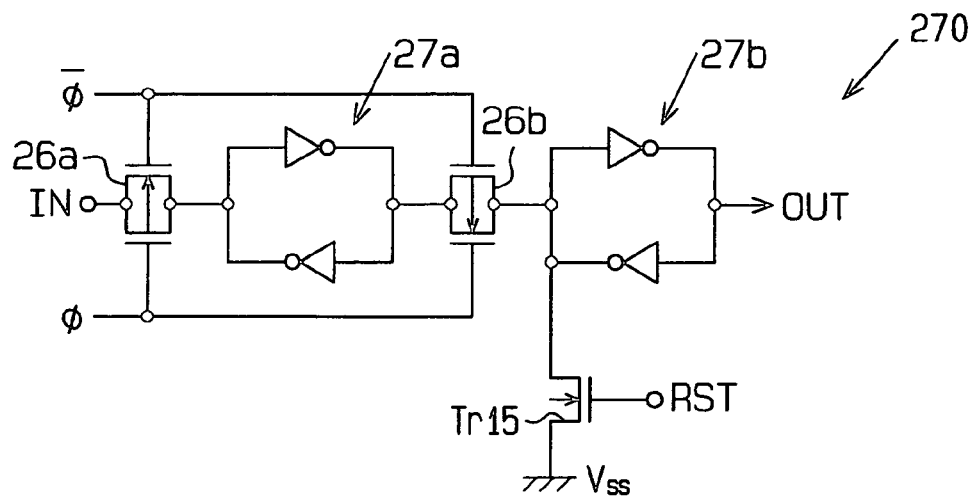
FIG. 13 is a schematic circuit diagram of a conventional data transfer circuit.

FIG. 13 is a schematic circuit diagram of a conventional data transfer circuit 270 provided in a memory circuit. In the data transfer circuit 270, an input signal IN is supplied to a first latch circuit 27a via a transfer gate 26a, the latch signal of the latch circuit 27a is provided to a second latch circuit 27b via a transfer gate 26b, then an output signal OUT is output from the second latch circuit 27b.

A clock signal φ is supplied to the gate of the P-channel transistor of the transfer gate 26a and the gate of the N-channel transistor of the transfer gate 26b. A clock signal /φ is supplied to the gate of the N-channel transistor of the transfer gate 26a and the gate of the P-channel transistor of the transfer gate 26b.

The input terminal of the latch circuit 27b is connected to the power supply Vss via the NMOS transistor Tr15 and a reset signal RST is supplied to the gate of the transistor Tr15.

Figure 14:
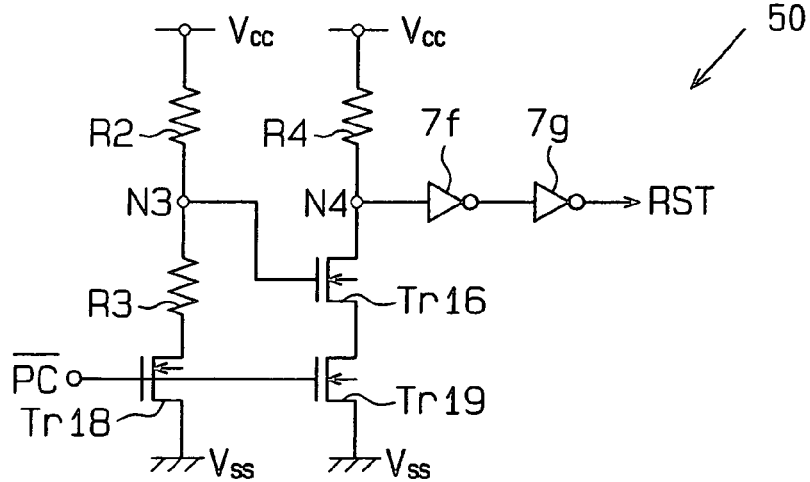
FIG. 14(a) is a schematic circuit diagram of a power-on reset circuit and FIG. 14(b) is a signal waveform diagram showing the operation of the power-on reset circuit.
Figure 14:
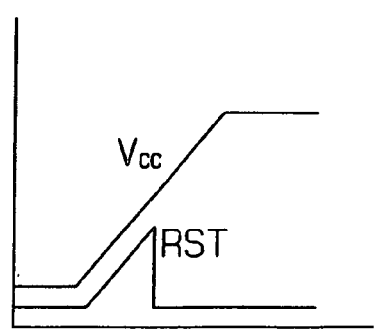

FIG. 14(a) is a schematic circuit diagram of a power-on reset circuit 50 which generates the reset signal RST when a power supply Vcc and a power supply Vss are provided. Resistors R2 and R3 and an NMOS transistor Tr18 are connected in series between the power supplies Vcc and Vss and a node N3 between the resistors R2 and R3 is connected to the gate of the NMOS transistor Tr16.

The drain (a node N4) of an NMOS transistor Tr16 is connected to the power supply Vss via a resistor R4 and the source of the NMOS transistor Tr16 is connected to the power supply Vss via an NMOS transistor Tr19. A stop signal /PC is supplied to the gates of the NMOS transistors Tr18 and Tr19.

The node N4 is connected to the input terminal of an inverter circuit 7f and the output signal of the inverter circuit 7f is output via an inverter circuit 7g as the reset signal RST.

In the power-on reset circuit 50, in the normal mode in which the stop signal /PC is set to the H level, as shown in FIG. 14(b), when the power supply Vcc and the power supply Vss are provided, the potential of the nodes N3 and N4, i.e., the reset signal RST rises together with the level of power supply Vcc. When the potential difference between the node N3 and the power supply Vss exceeds the threshold of the NMOS transistor Tr16, the transistor Tr16 is turned on and the node N4 is set to substantially the level of the power supply Vss, then the reset signal RST is immediately set to the L level.

Thus, when the power supply Vcc and the power supply Vss are provided, the power-on reset circuit 50 generates the reset signal RST that is a pulse signal which rises together with the power supply Vcc and falls to the L level when the voltage of the power supply Vss exceeds the threshold of the NMOS transistor Tr16.

In the power-on reset circuit 50, in the stop mode in which a stop signal PC is set to the H level, a stop signal /PC is set to the L level and the NMOS transistors Tr18 and Tr19 are turned off. Thereupon, the D.C. flowing in the resistors R2 and R3 and the D.C. flowing from the resistor R4 to the NMOS transistor Tr16 are cut off and the nodes N3 and N4 are set to the level of power supply Vcc, then the reset signal RST is set to the H level. In the stop mode, although the reset signal RST is fixed to the H level in this manner, there is no hindrance in the operation of a memory circuit.

In the normal mode, an input signal IN is sequentially transferred to the latch circuits 27a and 27b by the inversion of clock signals φ and /φ and an output signal OUT is output from the latch circuit 27b. Further, when the power is provided, the NMOS transistor Tr15 is temporarily turned on and the output signal OUT is reset to the H level by the reset signal RST.

However, in the conventional data transfer circuit 270, when the normal mode is switched to the stop mode, the output signal OUT output from the data transfer circuit 270 may become indefinite. Specifically, in the stop mode, the clock signal φ is fixed to the L level and the clock signal /φ is fixed to the H level. Thereupon, the transfer gate 26a is fixed to the electrically conducted state and the transfer gate 26b is fixed to the electrically non-conducted state and the latch circuit 27a latches the input signal IN immediately before the normal mode is switched to the stop mode.

When the normal mode is returned from the stop mode, the latched data of the latch circuit 27a is output as an output signal OUT via the transfer gate 26b and the latch circuit 27b due to the inversion operation of the clock signals φ and /φ. Thus, the output signal OUT is indefinite.

Figure 15:
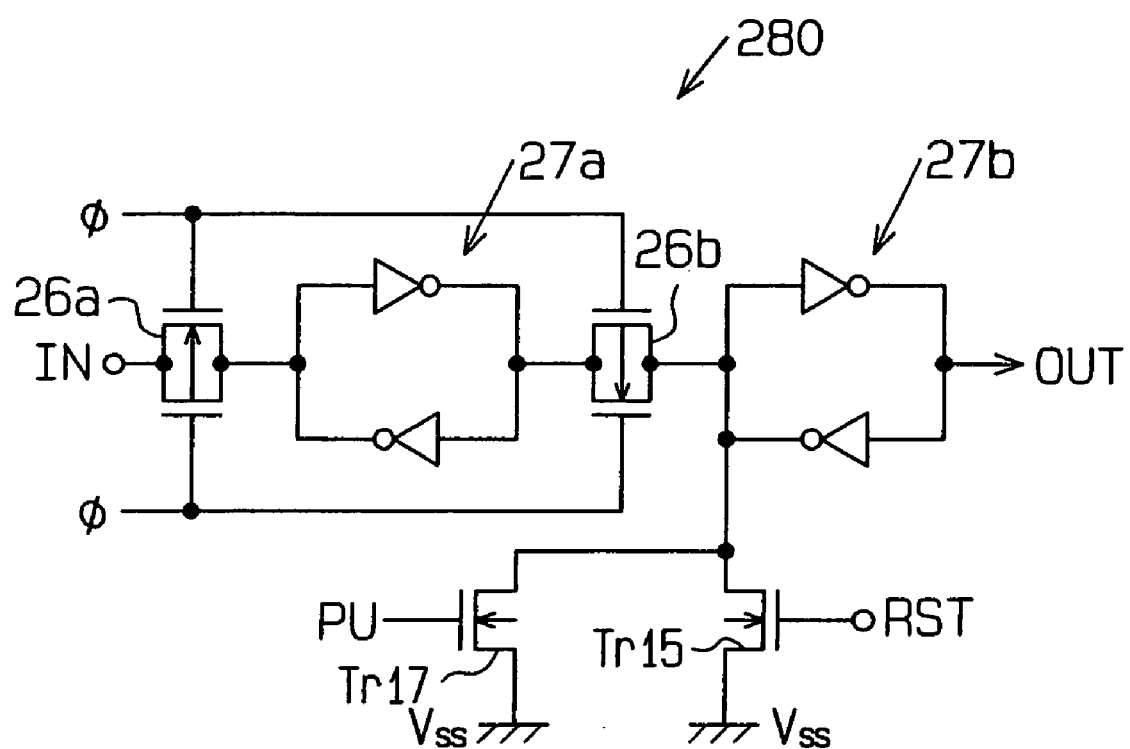
FIG. 15 is a schematic circuit diagram of a data transfer circuit according to a fifth embodiment of the present invention.

FIG. 15 is a schematic circuit diagram of a data transfer circuit 280 according to a fifth embodiment of the present invention. The data transfer circuit 280 comprises the NMOS transistor Tr17 connected in parallel to the NMOS transistor Tr15 and a start signal PU is supplied to the gate of the NMOS transistor Tr17.

In such data transfer circuit 280, when the normal mode is switched from the stop mode, the transistor Tr17 is temporarily turned on in response to the start signal PU from the start signal generation circuit 24 and the output signal OUT of the latch circuit 27b is reset to the H level. Accordingly, when the normal mode is switched from the stop mode, since an indefinite output signal OUT is not output from the latch circuit 27b, the circuit at the back stage that receives the output signal OUT operates normally.

(Sixth Embodiment)

Figure 16:
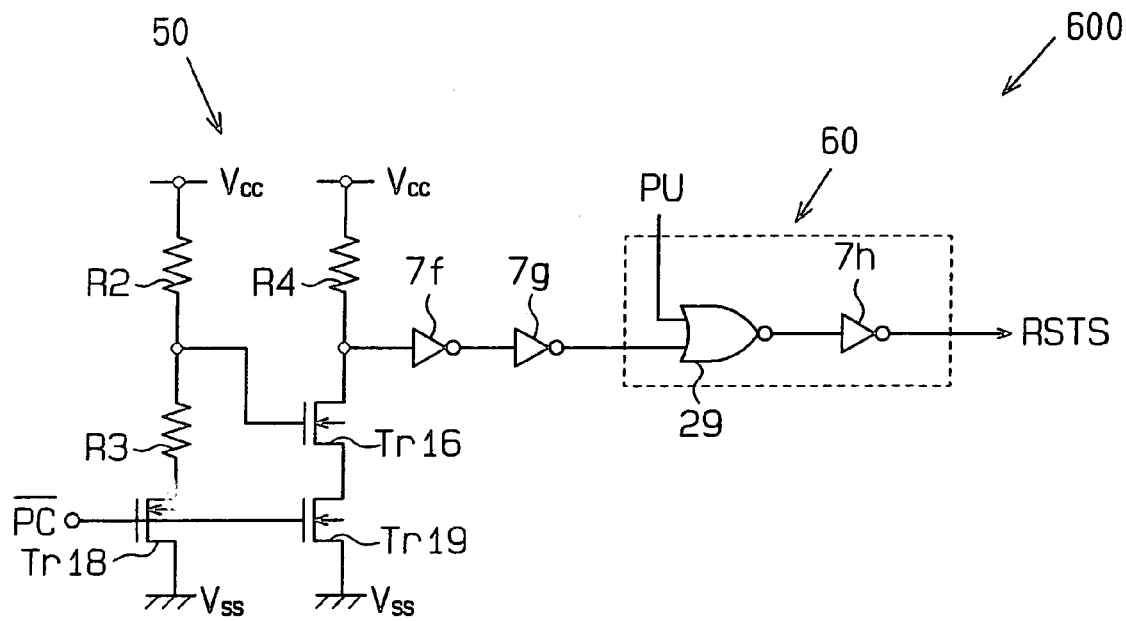
FIG. 16 is a schematic circuit diagram of a reset circuit according to a sixth embodiment of the present invention.

FIG. 16 is a schematic circuit diagram of a reset circuit 600 according to a sixth embodiment of the present invention. The reset circuit 600 comprises the power-on reset circuit 50 and a composite reset signal generation circuit 60 which generates a composite reset signal RSTS by logically combining the reset signal RST from the power-on reset circuit 50 and the start signal PU of the start signal generation circuit 24.

The composite reset signal generation circuit 60 includes a NOR circuit 29 which generates a logical composite signal by receiving the reset signal RST generated in the power-on reset circuit 50 and the start signal PU generated in the start signal generation circuit 24 and an inverter circuit 7h which receives the logical composite signal from the NOR circuit 29 and generates a composite reset signal RSTS. The composite reset signal RSTS is set to the H level when at least either the reset signal RST or the start signal PU is set to the H level.

The composite reset signal RSTS is supplied to the gate of the transistor Tr15 of the data transfer circuit 270 of FIG. 13. In the data transfer circuit 270, the output signal OUT of the latch circuit 27b is reset to the H level in accordance with the composite reset signal RSTS when the power supply Vcc and the power supply Vss are provided and when the normal mode is switched from the stop mode. Accordingly, by using the composite reset signal RSTS, the transistor Tr17 of the data transfer circuit 280 of FIG. 15 and the wiring for supplying a start signal PU to the gate of the transistor Tr17 are unnecessary. As a result, the number of elements and wiring of the memory circuit 12 comprising a plurality of data transfer circuits are reduced.

Figure 17:
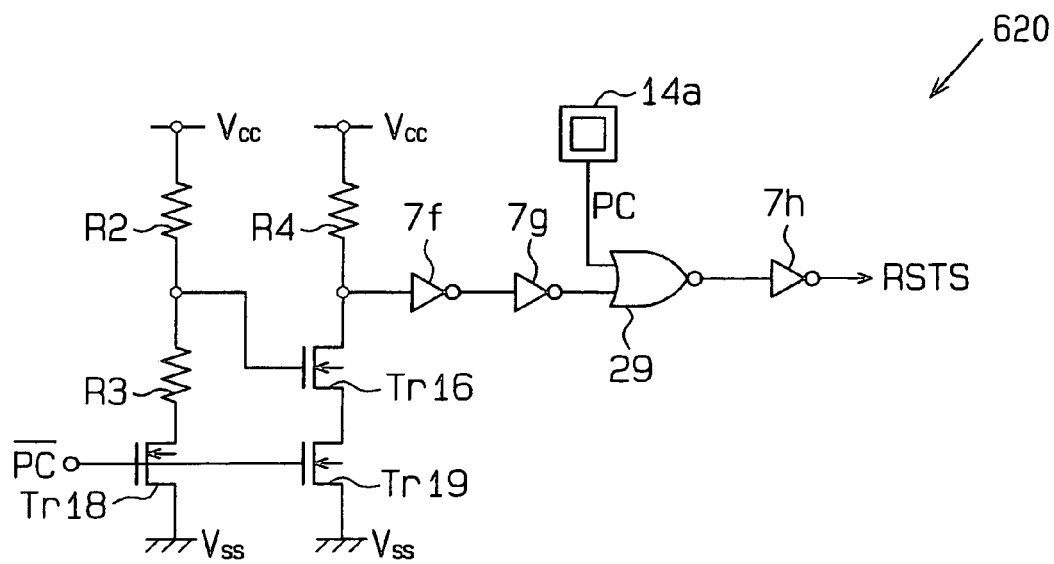
FIG. 17 is a schematic circuit diagram of another example of a reset circuit.

In the sixth embodiment, as shown in FIG. 17, the stop signal PC supplied from the external terminal 14a may also be supplied to the NOR circuit 29 instead of the start signal PU.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A semiconductor device, comprising:
   a logic circuit; and
   a macro circuit including a circuit that consumes direct current and stops operation in response to a stop signal indicating that a mode is changed from a normal mode to a stop mode, wherein the direct current consumption circuit includes a reference voltage generation circuit that generates a reference voltage from a power supply voltage, and the reference voltage generation circuit includes:
   a reference voltage generation section for generating the reference voltage;
   a first switching circuit connected to the reference voltage generation section for cutting off the direct current that flows in the reference voltage generation circuit in response to the stop signal in the stop mode;
   a start signal generation circuit for generating a start signal in response to the stop signal indicating that a mode is changed from the stop mode to the normal mode; and
   a second switching circuit connected to the reference voltage generation section and the start signal generation circuit for starting the reference voltage generation circuit in response to the start signal.

2. The semiconductor device of claim 1, wherein the macro circuit includes:

a data transfer circuit for generating a transfer data signal from an input data signal in accordance with a clock signal;

a first reset circuit connected to the data transfer circuit for resetting the transfer data signal of the data transfer circuit in response to a reset signal;

a power-on reset circuit connected to the first reset circuit for generating the reset signal when power is provided thereto; and a second reset circuit connected to the start signal generation circuit and the data transfer circuit for resetting the transfer data signal in response to the start signal.

3. The semiconductor device of claim 1, wherein the macro circuit includes:

a data transfer circuit for generating a transfer data signal from an input signal in accordance with a clock signal;

a power-on reset circuit for generating a reset signal when power is provided thereto;

a composite circuit connected to the power-on reset circuit and the start signal generation circuit for generating a composite reset signal by combining the start signal and the reset signal; and a reset circuit connected to the composite circuit for resetting the transfer data signal in response to the composite reset signal.

4. The semiconductor device of claim 1, wherein the macro circuit includes:

a data transfer circuit for generating a transfer data signal from an input data signal in accordance with a clock signal;

a power-on reset circuit for generating a reset signal when power is provided thereto;

a composite circuit connected to the power-on reset circuit for generating a composite reset signal by combining the stop signal and the reset signal; and a reset circuit connected to the composite circuit for resetting the transfer data signal in response to the composite reset signal.

5. The semiconductor device of claim 1, further comprising:

a first external terminal connected to the direct current consumption circuit for receiving the stop signal; and a second external terminal connected to the logic circuit, wherein the second external terminal is used to supply a test signal for performing a current test of the logic circuit.

* * * * *